United States Patent
Lee

(10) Patent No.: US 8,711,626 B2
(45) Date of Patent: Apr. 29, 2014

(54) FLASH MEMORY APPARATUS AND METHOD FOR GENERATING READ VOLTAGE THEREOF

(75) Inventor: Sang Kyu Lee, Ichon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 351 days.

(21) Appl. No.: 13/182,046

(22) Filed: Jul. 13, 2011

(65) Prior Publication Data
US 2012/0250412 A1 Oct. 4, 2012

(30) Foreign Application Priority Data

Mar. 28, 2011 (KR) ........................ 10-2011-0027572

(51) Int. Cl.
*G11C 16/10* (2006.01)
*G11C 16/04* (2006.01)

(52) U.S. Cl.
USPC ............... 365/185.11; 365/185.2; 365/185.18

(58) Field of Classification Search
USPC .............................. 365/185.11, 185.2, 185.18
See application file for complete search history.

(56) References Cited

U.S. PATENT DOCUMENTS

| | | | | |
|---|---|---|---|---|
| 6,707,718 B1 * | 3/2004 | Halim et al. | ............. | 365/185.22 |
| 2007/0140003 A1 * | 6/2007 | Ido | ............... | 365/185.2 |
| 2009/0164710 A1 * | 6/2009 | Choi et al. | .................... | 711/103 |
| 2011/0255347 A1 * | 10/2011 | Mori et al. | ............... | 365/185.25 |

FOREIGN PATENT DOCUMENTS

| KR | 100837282 B1 | 6/2008 |
|---|---|---|
| KR | 1020110004100 A | 1/2011 |

* cited by examiner

*Primary Examiner* — Hoai V Ho
*Assistant Examiner* — Tri Hoang
(74) *Attorney, Agent, or Firm* — William Park & Associates Patent Ltd.

(57) ABSTRACT

A flash memory apparatus includes: a cell array including a plurality of main blocks, a code addressable memory (CAM) block, and a security block; a control unit configured to detect a threshold voltage change data of a main block to which a program operation has been performed among the plurality of main blocks, and set a trimming value corresponding to the detected threshold voltage change data; and a read voltage generation unit configured to generate a read voltage according to the set trimming value.

22 Claims, 4 Drawing Sheets

FLASH MEMORY APPARATUS AND METHOD FOR GENERATING READ VOLTAGE THEREOF

CROSS-REFERENCES TO RELATED APPLICATION

The present application claims priority under 35 U.S.C. §119(a) to Korean Application No. 10-2011-0027572, filed on Mar. 28, 2011, in the Korean Intellectual Property Office, which is incorporated herein by reference in its entirety as if set forth in full.

BACKGROUND

1. Technical Field

Various embodiments of the present invention relates to a flash memory apparatuses and related methods. In particular, certain embodiments relate to a flash memory apparatus and a method for generating a read voltage thereof.

2. Related Art

A flash memory apparatus is a type of semiconductor memory apparatus that is electrically programmable and erasable and requires no refresh operation of rewriting data at constant intervals. The term "program" refers to an operation of writing data to a memory cell, and the term "erase" refers to an operation of erasing data written to a memory cell.

In such a flash memory apparatus, when a program voltage is applied to a control gate through a selected word line, Fowler-Nordheim (F-N) tunneling occurs between a semiconductor substrate and a floating gate, and electrons from a semiconductor substrate flow into a floating gate. In this manner, a program operation is performed. The floating gate into which the electrons flow becomes a programmed cell, and a threshold voltage (Vt) thereof becomes higher than that of an erased cell. The erased cell and the programmed cell can be distinguished by reading a difference of a threshold voltage distribution.

In a conventional flash memory apparatus, however, electrons in an oxide film of a memory cell are trapped during a repetitive F-N tunneling for the program and erase operations, leading to a change in a threshold voltage (Vt) of a memory cell.

Consequently, a flash memory apparatus may incorrectly recognize data stored in a memory cell in a data read operation, causing a degradation in the reliability of a memory cell.

SUMMARY

Accordingly, there is a need for a flash memory apparatus capable of minimizing errors in a data read operation and a method for generating a read voltage thereof.

To attain the advantages and in accordance with the purposes of the invention, as embodied and broadly described herein, a flash memory apparatus may comprise: a cell array including a plurality of main blocks, a code addressable memory (CAM) block, and a security block; a control unit configured to detect a threshold voltage change data of a main block to which a program operation has been performed among the plurality of main blocks, and set a trimming value corresponding to the detected threshold voltage change data; and a read voltage generation unit configured to generate a read voltage according to the set trimming value.

In another exemplary aspect of the present invention, a flash memory apparatus may comprise: a cell array in which a plurality of main cells and a plurality of CAM cells are arranged; a control unit configured to select main cells to which a program operation is to be performed among the plurality of main cells, when a program operation command is inputted, perform a program operation on the selected main cells, detect threshold voltage change data of the main cells to which the program operation has been performed, set a trimming value corresponding to the detected threshold voltage change data, and store the set trimming value in the CAM cells; and a read voltage generation unit configured to generate a read voltage according to the trimming value stored in the CAM cell.

In another exemplary aspect of the present invention, a method for generating a read voltage of a flash memory apparatus including a plurality of main blocks, a CAM block, and a security block, may comprise: selecting two or more main blocks among the plurality of main blocks and performing a program operation on the selected main blocks; detecting threshold voltage distributions of the two or more main blocks to which the program operation has been performed; setting a trimming value based on the detected threshold voltage distributions; and generating a read voltage according to the set trimming value.

In another exemplary aspect of the present invention, a method for generating a read voltage of a flash memory apparatus in which a plurality of main cells and a plurality of CAM cells are arranged, may comprise: selecting one or more main cells among the plurality of main cells when a program operation command is inputted, and performing a first program operation and a second program operation on the selected main cells; detecting a first threshold voltage distribution to which the first program operation has been performed and a second threshold voltage distribution to which the second program operation has been performed, when the first program operation and the second program operation are passed; setting a trimming value based on the first threshold voltage distribution and the second threshold voltage distribution; storing the set trimming value in the CAM cells; reading the trimming value stored in the CAM cells when a read command is inputted; and generating a read voltage according to the read trimming value.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

DETAILED DESCRIPTION

Figure 1:
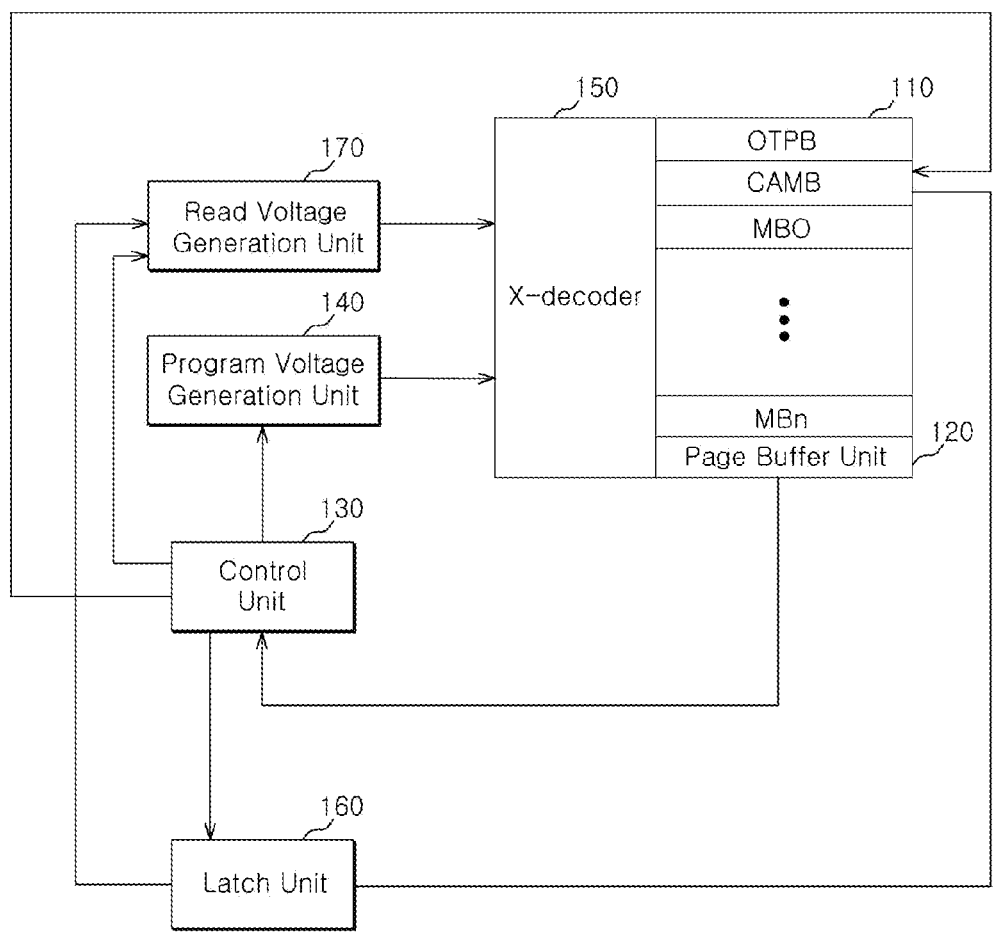
FIG. 1 is a block diagram of a flash memory apparatus according to an embodiment of the present invention.

Reference will now be made in detail to the exemplary embodiments consistent with the present disclosure, examples of which are illustrated in the accompanying drawings. Wherever possible, the same reference characters will be used throughout the drawings to refer to the same or like parts.

FIG. 1 is a block diagram of a flash memory apparatus according to an exemplary embodiment of the present invention.

Referring to FIG. 1, a flash memory apparatus 100 according to an embodiment of the present invention may include a cell array 110, a page buffer unit 120, a control unit 130, a program voltage generation unit 140, an X-decoder 150, a latch unit 160, and a read voltage generation unit 170.

The cell array 110 may include a plurality of main blocks MB0 through MBn, a code addressable memory (CAM) block CAMB, and a security block OTPB.

A plurality of memory cells are arranged in the main blocks MB0 through MBn, and the main blocks MB0 through MBn store main data that can be read, written, or erased by a user.

A plurality of CAM cells are arranged in the CAM block CAMB. The CAM cells store data programmed in the main blocks MB0 through MBn. An operation of generating a read voltage using data stored in the CAM cells will be described below in detail.

The security block OTPB stores data related to the security of the flash memory apparatus 100, such as READ IP or OTP test circuit.

The page buffer unit 120 reads a threshold voltage change data of a memory block, to which erase and program operations are performed, and temporarily stores the read threshold voltage change data.

When an external program operation command is inputted, the control unit 130 controls the program voltage generation unit 140 to generate a voltage to be applied in the program operation. In addition, the control unit 130 receives the result of the program operation, i.e., the threshold voltage change data, from the page buffer unit 120, divides a gap between the respective programmed cells into a plurality of cells at constant intervals, and stores trimming values set according to the divided levels in the CAM block CAMB. Then, when an external read command is inputted, the control unit 130 performs a control operation to read the trimming values from the CAM block CAMB.

The program voltage generation unit 140 generates a voltage in the program operation under the control of the control unit 130.

The X-decoder 150 selectively enables one or more main blocks MB0 through MBn among the plurality of main blocks MB0 through MBn, and applies an operation voltage provided from the program voltage generation unit 140 to global lines of the enabled main blocks in the program operation or the data read operation.

The latch unit 160 reads the trimming values stored in the CAM cell and temporarily stores the read trimming values.

When the external read command is inputted, the read voltage generation unit 170 receives the trimming value read from the CAM cell and generates a read voltage corresponding to the received trimming value under the control of the control unit 130.

In the flash memory apparatus 100 configured as above according to the embodiment of the present invention, the operation of setting the trimming value in the programmed main block according to the threshold voltage distribution will be described below in more detail.

Figure 2:
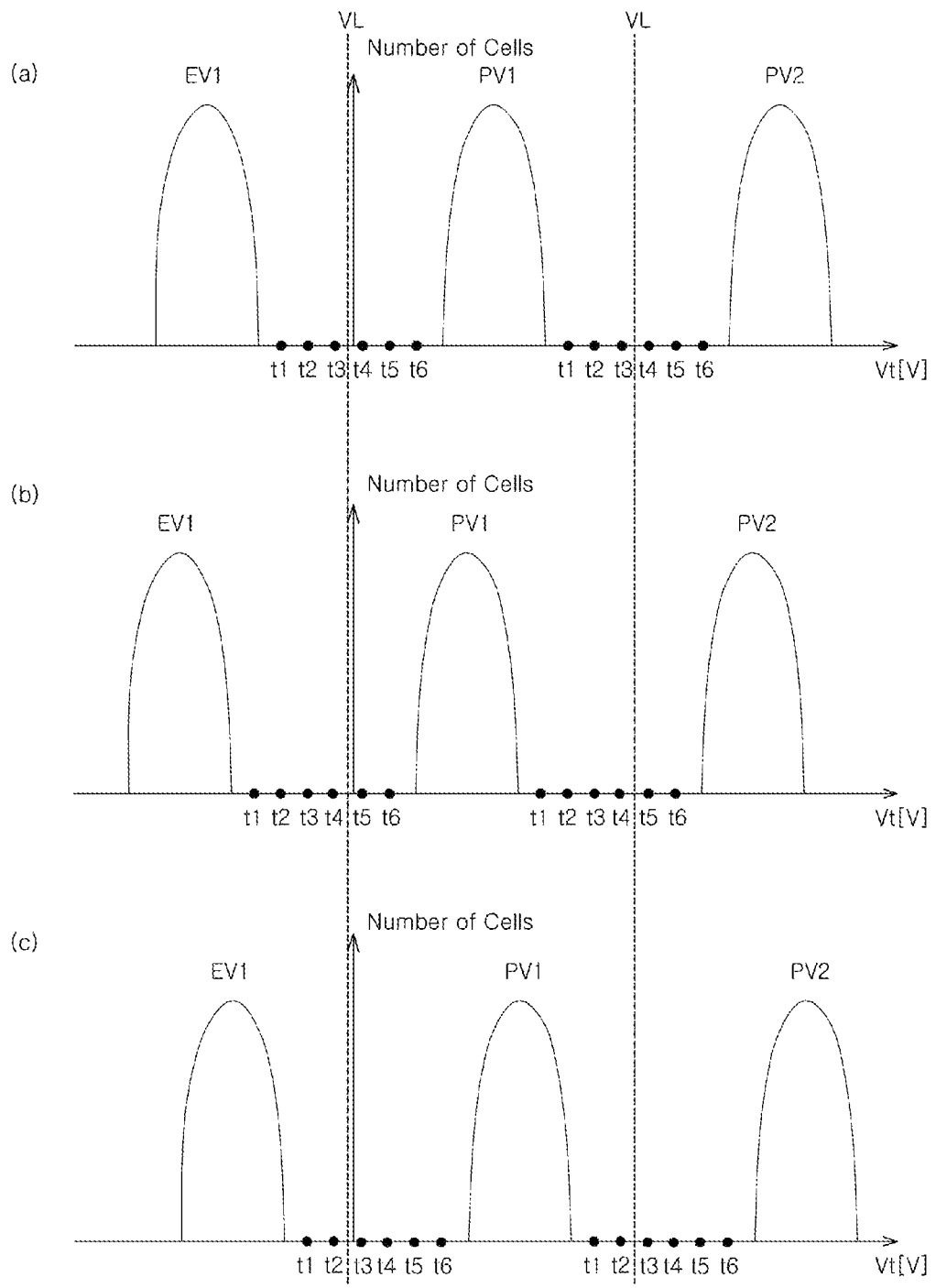
FIG. 2 is a diagram explaining an operation of setting a trimming value in a flash memory apparatus according to an embodiment of the present invention.

FIG. 2 is a diagram explaining the operation of setting the trimming value in the flash memory apparatus according to the embodiment of the present invention.

Referring to FIG. 2, when the program operation command is inputted, the flash memory apparatus 100 according to the embodiment of the present invention selects one or more main blocks among the plurality of main blocks MB0 through MBn and performs the program operation on the selected main blocks. The program operation of the flash memory apparatus 100 according to the embodiment of the present invention is performed using a known technique, and a description thereof will be omitted.

FIG. 2A shows a first threshold voltage distribution EV1 of memory cells to which an erase operation has been performed, a second threshold voltage distribution PV1 of memory cells to which a first program operation has been performed, and a third threshold voltage distribution PV2 of memory cells to which a second program operation has been performed, upon execution of the program operation. At this time, a verification operation is performed to verify whether the erase operation, the first program operation, and the second program operation are correctly performed. Verification lines VL for these operations are previously set.

In the flash memory apparatus, however, as the erase operation or the program operation is performed many times according to the verification lines VL, electrons are trapped into the memory cells. Thus, as illustrated in FIGS. 2B and 2C, the threshold voltage distributions may be changed.

Accordingly, as illustrated in FIGS. 2A, 2B and 2C, a gap between the first threshold voltage distribution EV1 of the memory cells to which the erase operation has been performed and the second threshold voltage distribution PV1 of the memory cells to which the first program operation has been performed is leveled to have a plurality of levels t1, t2, t3, t4, t5 and t6 at constant intervals, i.e., the same intervals. Although it has been described as if the leveling is to divide the gap between the first threshold voltage distribution EV1 of the memory cells to which the erase operation has been performed and the second threshold voltage distribution PV1 of the memory cells to which the first program operation has been performed at constant intervals, the present invention is not limited thereto. The gap between the second threshold voltage distribution PV1 of the memory cells to which the first program operation has been performed and the third threshold voltage distribution PV2 of the memory cells to which the second program operation has been performed may be leveled to have a plurality of levels t1, t2, t3, t4, t5 and t6 at constant intervals. At this time, the value obtained by dividing the gap between the first threshold voltage distribution EV1 and the second threshold voltage distribution PV1 is substantially equal to the value obtained by dividing the gap between the second threshold voltage distribution PV1 and the third threshold voltage distribution PV2. This is because the preset verification lines VL are set at the same intervals.

After dividing the gap between the first threshold voltage distribution EV1 and the second threshold voltage distribution PV1 to have the plurality of levels t1, t2, t3, t4, t5 and t6, a negative level value relative to the verification line VL is set to '0', and a positive level relative to the verification line VL is set to '1'. That is, FIG. 2A has a trimming value of '000111', and FIG. 2B has a trimming value of '000011'. FIG. 2C has a trimming value of '001111'. In the embodiment of the present invention, the gap between the respective threshold voltage distributions is divided to have six levels, but the present invention is not limited thereto.

The above-mentioned operation is performed by the control unit 130, and the values set by the control unit 130 are stored in the CAM cells of the CAM block CAMB. When the read command is inputted, the stored trimming values are read from the CAM cells, and the read trimming values are inputted to the read voltage generation unit 170 to generate the read voltage corresponding to the trimming value. In this manner, a stable read operation is achieved. The read voltage generation unit 170 of the flash memory apparatus 100 according to the embodiment of the present invention will be described below in more detail with reference to FIG. 3.

Figure 3:
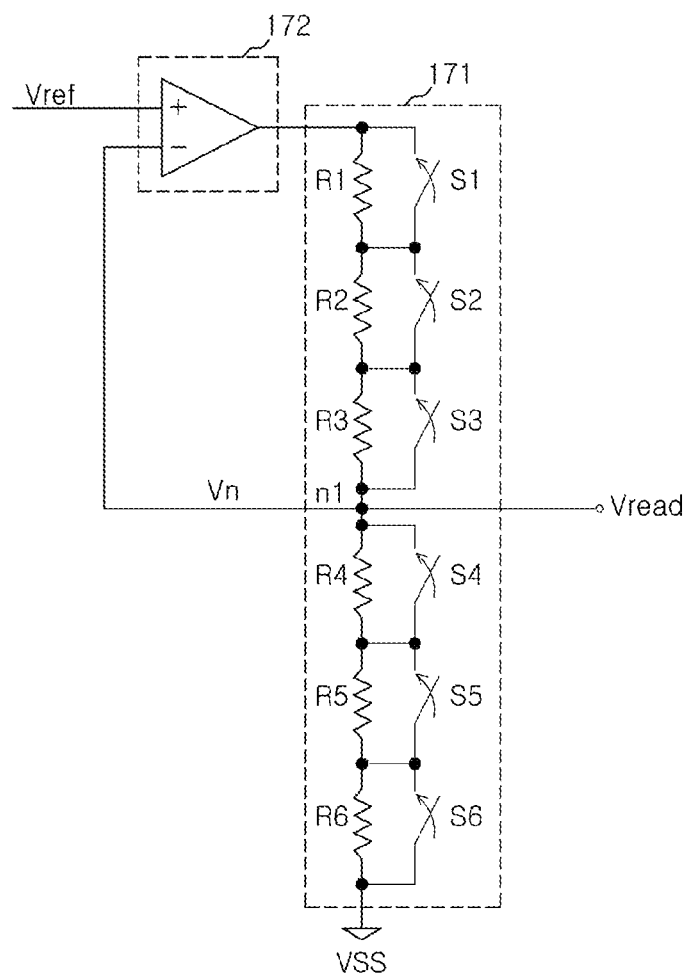
FIG. 3 is a circuit diagram of a read voltage generation unit in the flash memory apparatus according to an embodiment of the present invention.

FIG. 3 is a circuit diagram of the read voltage generation unit in the flash memory apparatus according to an embodiment of the present invention.

FIG. 3, the read voltage generation unit 170 of the flash memory apparatus 100 according to the embodiment of the present invention includes a trimming section 171 and a comparison section 172.

The trimming section 171 includes a plurality of resistors R1, R2, R3, R4, R5 and R6 coupled in series, and a plurality of switches S1, S2, S3, S4, S5 and S6 configured to perform a control operation to exhibit resistances of the resistors R1, R2, R3, R4, R5 and R6. The switches S1, S2, S3, S4, S5 and S6 are turned on/off according to the trimming value stored in the latch unit 160. For example, if the trimming value is '000111', the first, second and third switches S1, S2 and S3 among the plurality of switches S1, S2, S3, S4, S5 and S6 are turned off, and the switches S4, S5 and S6 are turned on. The number of the plurality of resistors R1, R2, R3, R4, R5 and R6 and the number of the switches S1, S2, S3, S4, S5 and S6 are related to division of the gap between the threshold voltage changes to have a plurality of levels. That is, if the gap between the threshold voltage changes is divided to have four levels, the number of the resistors and the number of the switches are four, respectively.

The comparison section 172 compares a reference voltage Vref with an output voltage Vn generated by an output node n1 and generates a read voltage Vread.

The operation characteristic of the read voltage generation unit 170 will be described below. The on/off operation of the switches S1, S2, S3, S4, S5 and S6 of the trimming section 141 is controlled according to the read trimming value of '000111' in FIG. 2A. That is, the first, second and third switches S1, S2 and S3 are turned off and thus no current flows through the first, second and third resistors R1, R2 and R3. The fourth, fifth and sixth switches S4, S5 and S6 are turned on and thus a current flows through R4, R5 and R6.

Accordingly, when assuming that a constant current flows (i.e., I=1), the voltage Vn of the output node n1 has a value of 3/6. '000111' means that there is no change in the threshold voltage distribution based on the verification line VL. Thus, the most ideal read voltage Vread is generated and applied to the main block. In this manner, the read voltage Vread generated by the input of a default value may be previously set as the reference voltage Vread.

The on/off operation of the switches S1, S2, S3, S4, S5 and S6 of the trimming section 171 is controlled according to the read trimming value of '000011' in FIG. 2B. That is, the first, second, third and fourth switches S1, S2, S3 and S4 are turned off and thus no current flows through the first, second, third and fourth resistors R1, R2, R3 and R4. The fifth and sixth switches S5 and S6 are turned on and thus a current flows through the fifth and sixth resistors R5 and R6.

Accordingly, when assuming that a constant current flows (i.e., I=1), the voltage Vn of the output node n1 has a value of 2/6. In this case, when compared with the reference voltage Vref, it can be seen that the threshold voltage distribution is shifted to a negative region. Hence, if the trimming value as shown in FIG. 2B is inputted, the read voltage Vread lower than the reference voltage Vref is generated.

The on/off operation of the switches S1, S2, S3, S4, S5 and S6 of the trimming section 171 is controlled according to the read trimming value '001111' in FIG. 2C. That is, the first and second switches S1 and S2 are turned off and thus no current flows through the first and second resistors R1 and R2. The third, fourth, fifth and sixth switches S1, S2, S3, S4, S5 and S6 are turned on and thus a current flows through the third, fourth, fifth and sixth resistors R3, R4, R5 and R6.

Accordingly, when assuming that a constant current flows (i.e., I=1), the voltage Vn of the output node n1 has a value of 4/6. In this case, when compared with the reference voltage Vref, it can be seen that the threshold voltage distribution is shifted to a positive region. Hence, if the trimming value as shown in FIG. 2C is inputted, the read voltage Vread higher than the reference voltage Vref is generated.

Therefore, the read voltage generation unit 170 has the greatest level difference from the reference voltage Vref when the trimming value is '111111' or '000000'.

Figure 4:
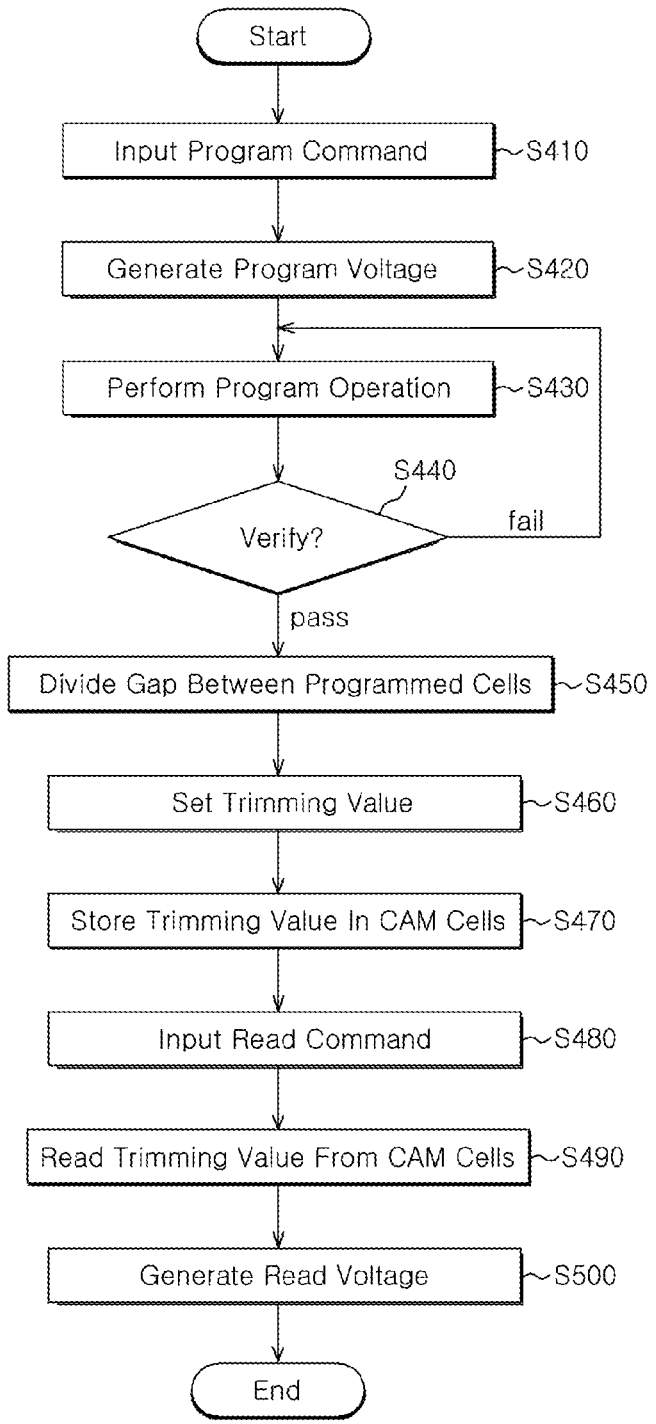
FIG. 4 is a flowchart illustrating a process of generating a read voltage in the flash memory apparatus according to an embodiment of the present invention.

FIG. 4 is a flowchart illustrating a sequential process of generating a read voltage in a flash memory apparatus according to an embodiment of the present invention.

Referring to FIG. 4, in the flash memory apparatus 100 according to the embodiment of the present invention, when the external program command is inputted (S410), the control unit 130 generates the program execution command and controls the program voltage generation unit 140 to generate the program voltage (S420).

The generated program voltage is applied to the X-decoder 150, and the X-decoder 150 selects one or more main blocks among the plurality of main blocks MB0 through MBn, applies the program voltage to the global line of the selected main block to execute the program operation (S430).

After the execution of the program operation, the verification operation is performed to verify whether the program operation is correctly performed through the threshold voltage distribution (S440). In the verification operation, the erase operation during the program operation is an operation of verifying whether the threshold voltages of the erased cells are positioned in the negative region, and the first and second program operations are operations of verifying whether the threshold voltages of the programmed cells are positioned in the positive region.

As the result of the verification operation, if it is verified that the erased cells are correctly erased and the programmed cells are correctly programmed, it is determined as a pass and thus the gap between the threshold voltage distributions, i.e., the gap between the programmed cells, is divided at the same intervals to have a plurality of levels (S450). Meanwhile, as the result of the verification operation, it is verified that the erased cells are not correctly erased and the programmed cells are not correctly programmed, it is determined as a fail and thus the program operation is performed again (S430).

The plurality of levels divided at the same intervals are read and set as the trimming values (S460). As such, the process of setting the read values as the trimming values reads the plurality of levels based on the preset verification lines VL. A level positioned in a negative region relative to the verification line VL is read as '0', and a level positioned in a positive region relative to the verification line VL is read as '1'.

The read trimming values are stored in the CAM cells of the CAM block CAMB (S470). At this time, the step of storing the trimming values in the CAM cells may be skipped. In case where the read voltage Vread needs to be generated immediately after the program operation, the read voltage Vread may be generated by inputting the trimming values to the read voltage generation unit 170 under the control of the control unit 130, without storing the trimming values in the CAM cells.

When the external read command is inputted (S480), the control unit 130 reads the trimming values stored in the CAM cells (S490).

After the read trimming values are temporarily stored in the latch unit 160, the read trimming values are inputted to the read voltage generation unit 170, and the read voltage generation unit 170 generates the read voltages Vread having different levels according to the inputted trimming values (S500).

As described above, in the flash memory apparatus and the method for generating the read voltage thereof according to the embodiments of the present invention, the threshold voltage value changed during the program operation is converted into the trimming value, and the trimming value is stored in the CAM cell. Then, upon the input of the read command, the read voltage is generated according to the trimming value stored in the CAM cells, i.e., the threshold voltage change of the cells and then applied, thereby minimizing errors during the read operation.

Moreover, in the flash memory apparatus and the method for generating the read voltage thereof according to the embodiments of the present invention, when over-programmed during the program operation, the operation of shifting the threshold voltage distribution by gradually raising the voltage applied to the corresponding memory cell can be skipped, thereby improving the program operation speed of the flash memory apparatus.

While certain embodiments have been described above, it will be understood to those skilled in the art that the embodiments described are by way of example only. Accordingly, the flash memory apparatus and the method for generating the read voltage thereof described herein should not be limited based on the described embodiments. Rather, the flash memory apparatus and the method for generating the read voltage thereof described herein should only be limited in light of the claims that follow when taken in conjunction with the above description and accompanying drawings.

What is claimed is:

1. A flash memory apparatus comprising:
   a cell array comprising a plurality of main blocks, a code addressable memory(CAM) block, and a security block;
   a control unit configured to detect a threshold voltage change data of a main block to which a program operation has been performed among the plurality of main block, perform a leveling operation to divide the threshold voltage change data of the main block to have a plurality of levels, read the plurality of levels with different value according to a level position based on verification lines previously set for determining whether the program operation is correctly performed, and set a trimming value corresponding to the read plurality of levels; and
   a read voltage generation unit configured to generate a read voltage according to the set trimming value.

2. The flash memory apparatus according to claim 1, wherein the leveling operation selects one of a gap between a first threshold voltage distribution of memory cells to which an erase operation has been performed and a second threshold voltage distribution of memory cells to which a first program operation has been performed, and a gap between the second threshold voltage distribution of the memory cells to which the first program operation has been performed and a third threshold voltage distribution of memory cells to which a second program operation has been performed, and divides the selected gap between the threshold voltage distributions at constant intervals to have a plurality of levels.

3. The flash memory apparatus according to claim 1, wherein the control unit reads a level positioned in a negative region relative to the verification line as 0, reads a level positioned in a positive region relative to the verification line as 1, and sets the read value as the trimming value.

4. The flash memory apparatus according to claim 1, wherein the read voltage generation unit comprises:
   a trimming section configured to operate according to the trimming value and output an output voltage; and
   a comparison section configured to compare the output voltage from the trimming section with a reference voltage and generate the read voltage.

5. A flash memory apparatus according to claim 1, wherein the trimming:
   a plurality of switches configured to be turned on/off according to the trimming value; and
   a plurality of resistors configured to change a current value according to the on/off operation of the plurality of switches.

6. The flash memory apparatus according to claim 5, wherein the comparison section generates the read voltage lower than the reference voltage when the level of the output voltage is lower than the level of the reference voltage, based on the trimming value, and generates the read voltage higher than the reference voltage when the level of the output voltage is higher than the level of the reference voltage, based on the trimming value.

7. The flash memory apparatus comprises:
   a cell array in which a plurality of main cells and a plurality of CAM cell are arranged;
   a control unit configured to select main cells to which a program operation is to be performed among the plurality of main cells, when a program operation command is inputted, perform a program operation on the selected main cells, detect threshold voltage change data of the main cells to which the program operation has been performed, perform a leveling operation to divide the threshold voltage change data of the main block to have a plurality of levels, reads the plurality of levels with different value according to a level position based on verification lines previously set for determining whether the program operation is correctly performed, set a trimming value corresponding to the read plurality of levels, and store the set trimming value in the CAM cells; and
   a read voltage generation unit configured to generate a read voltage according to the trimming value stored in the CAM cell.

8. The flash memory apparatus according to claim 7, wherein the control unit reads a level positioned in a negative region relative to the verification line as 0, reads a level positioned in a positive region relative to the verification line as 1, and sets the read value as the trimming value.

9. The flash memory apparatus according to claim 7, wherein the read voltage generation unit comprises:
   a trimming section configured to operate according to the trimming value and output and output voltage; and
   a comparison section configured to compare the output voltage from the trimming section with a reference voltage and generate a read voltage.

10. A flash memory apparatus according to claim 9, wherein the trimming section comprises:
- a plurality of switches configured to be turned on/off according to the trimming value; and
- a plurality of resistors configured to change a current value according to the on/off operation of the plurality of switches.

11. The flash memory apparatus according to claim 9, wherein the comparison section generates the read voltage lower than the reference voltage when the level of the output voltage is lower than the level of the reference voltage, based on the trimming value, and generates the read voltage higher than the reference voltage when the level of the output voltage is higher than the level of the reference voltage, based on the trimming value.

12. A method for generating a read voltage of a flash memory apparatus including a plurality of main blocks, a CAM block, and a security block, the method comprising:
- selecting two or more main blocks among the plurality of main blocks and performing a program operation on the selected main blocks;
- detecting threshold voltage distributions of the two or more main blocks to which the program operation has been performed;
- performing a leveling operation to divide the threshold voltage distributions of one of the plurality of main blocks to have a plurality of levels;
- reading the plurality of levels with different value according to a level position based on verification lines previously set for determining whether the program operation is correctly performed;
- setting a trimming value based on the read plurality of levels; and
- generating a read voltage according to the set trimming value.

13. The flash memory apparatus according to claim 12, wherein the step of performing a leveling operation comprises:
- dividing a gap between a first threshold voltage distribution of one or more main cells to which the program operation has been performed and a second threshold voltage distribution of one or more other main cells to which the program operation has been performed, to have a plurality of levels at constant intervals.

14. The method according to claim 13, wherein the trimming value sets a level positioned in a negative region relative to the verification line to 0, and sets a level positioned in a positive region relative to the verification line to 1.

15. The method according to claim 12, wherein the step of generating the read voltage comprises:
- inputting the trimming value and outputting an output voltage; and
- comparing the output voltage with a preset reference voltage and generating the read voltage.

16. The method according to claim 15, wherein the preset reference voltage is a read voltage generated when the trimming value is a default value.

17. The method according to claim 12, wherein generating the read voltage generates the read voltage lower than the reference voltage when the trimming value is reduced relative to the default value, and generates the read voltage higher than the reference voltage when the trimming value is increased relative to the default value.

18. A method for generating a read voltage of a flash memory apparatus in which a plurality of main cells and a plurality of CAM cells are arranged, the method comprising:
- selection one or more main cells among the plurality of main cells when a program operation command is inputted, and performing a first program operation and a second program operation on the selected main cells;
- detecting a first threshold voltage distribution to which the first program operation has been performed and a second threshold voltage distribution to which the second program operation has been performed, when the first program operation and the second program operation are passed;
- dividing a gap between the first threshold voltage distribution and the second threshold voltage distribution to have a plurality of levels at constant intervals;
- reading the plurality of levels with different value according to a level position based on verification lines previously set for determining whether the program operation is correctly performed;
- setting the read levels as the trimming value;
- storing the set trimming value in the CAM cells;
- reading the trimming value stored in the CAM cells when a read command in inputted; and
- generating a read voltage according to the read trimming value.

19. The method according to claim 18, wherein the trimming value sets a level positioned in a negative region relative to the verification line as 0, and sets a level positioned in a positive region relative to the verification line as 1.

20. The method according to claim 18, wherein generating the read voltage comprises:
- inputting the trimming value and outputting an output voltage; and
- comparing the output voltage with a preset reference voltage and generating a read voltage.

21. The method according to claim 20, wherein the preset reference voltage is a read voltage generated when the trimming value is a default value.

22. The method according to claim 18, wherein generating the read voltage generates the read voltage lower than the reference voltage when the trimming value is reduced relative to the default value, and generates the read voltage higher than the reference voltage when the trimming value is increased relative to the default value.

* * * * *